"(12) United States Patent
Huang et al.

(10) Patent No.: US 7,368,775 B2
(45) Date of Patent: May 6, 2008

(54) SINGLE TRANSISTOR DRAM CELL WITH REDUCED CURRENT LEAKAGE AND METHOD OF MANUFACTURE

(75) Inventors: Chih-Mu Huang, Hsin-Chu (TW); Mingchu King, Hsinchu (TW); Yun Chang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 28 days.

(21) Appl. No.: 10/903,084

(22) Filed: Jul. 31, 2004

(65) Prior Publication Data

US 2006/0022240 A1 Feb. 2, 2006

(51) Int. Cl.
*H01L 29/72* (2006.01)
(52) U.S. Cl. .................. 257/296; 257/306; 257/310; 257/311; 257/312; 257/384; 257/532
(58) Field of Classification Search ................ 257/296, 257/306, 310, 311, 312, 384, 532
See application file for complete search history.

(56) References Cited

U.S. PATENT DOCUMENTS

| | | | |
|---|---|---|---|
| 6,177,304 B1* | 1/2001 | Li et al. | 438/233 |
| 6,376,298 B1* | 4/2002 | Li et al. | 438/238 |
| 2002/0027227 A1* | 3/2002 | Kang | 257/66 |
| 2002/0093030 A1* | 7/2002 | Hsu et al. | 257/162 |
| 2004/0262660 A1* | 12/2004 | Huang | 257/301 |

\* cited by examiner

*Primary Examiner*—George Fourson
*Assistant Examiner*—Joannie Adelle Garcia
(74) *Attorney, Agent, or Firm*—Tung & Asscociates

(57) ABSTRACT

A single transistor planar DRAM memory cell with improved charge retention and reduced current leakage and a method for forming the same, the method including providing a semiconductor substrate; forming a gate dielectric on the semiconductor substrate; forming a pass transistor structure adjacent a storage capacitor structure on the gate dielectric; forming sidewall spacer dielectric portions adjacent either side of the pass transistor to include covering a space between the pass transistor and the storage capacitor; forming a photoresist mask portion covering the pass transistor and exposing the storage capacitor; and, carrying out a P type ion implantation and drive in process to form a P doped channel region in the semiconductor substrate underlying the storage capacitor.

11 Claims, 4 Drawing Sheets

SINGLE TRANSISTOR DRAM CELL WITH REDUCED CURRENT LEAKAGE AND METHOD OF MANUFACTURE

FIELD OF THE INVENTION

The present invention relates generally to semiconductor devices and manufacturing methods and more particularly to a single transistor DRAM (1T DRAM) memory cell and a method for manufacturing the same with reduced junction leakage, subthreshold leakage, and series resistance for improved performance including charge retention time.

BACKGROUND OF THE INVENTION

Dynamic random access memories (DRAM) are useful for maximizing the number of bits stored per unit surface area. In particular, a single transistor (1T) DRAM cell includes a single MOS transistor, also referred to as a pass transistor or an access transistor, which is connected to a word line which is used to switch the pass transistor on or off to thereby couple or decouple a bit line to a storage capacitor. When the storage capacitor is charged to a predetermined Voltage, the memory cell stores a "1" state. When the storage capacitor is charged to a lower predetermined Voltage, typically ground, the memory cell stores a "0" state.

The Voltage stored, e.g., as a "1" state in the memory cell decays over time to a lower "0" state Voltage (e.g., ground Voltage) through various leakage mechanisms. Unlike the charge replenishing process for static RAM, the only way to maintain the information in DRAM is by periodically reading and rewriting the data through a "refresh" operation. Avoiding current leakage and thereby maintaining charge retention in a DRAM cell is extremely important for scaling down memory cell size.

Several leakage mechanisms can affect the stored charge in DRAM cells including junction leakage, pass transistor threshold leakage, and leakage through the storage capacitor dielectric as well as other parasitic leakage paths. In particular, prior art memory 1T DRAM memory cells, including planar storage capacitors have unacceptable charge retention times for future applications at required memory cell densities.

Therefore, there is a continuing need in the DRAM processing art to develop a single transistor (1T) DRAM device with reduced parasitic current leakage, improved charge retention time, and improved performance at operating Voltages.

It is therefore among the objects of the invention to provide a single transistor (1T) DRAM device with reduced parasitic current leakage, improved charge retention time, and improved performance at operating Voltages, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a single transistor (1T) planar DRAM memory cell with improved charge retention and reduced current leakage and a method for forming the same.

In a first embodiment, the method includes providing a semiconductor substrate; forming a gate dielectric on the semiconductor substrate; forming a pass transistor structure adjacent a storage capacitor structure on the gate dielectric; forming sidewall spacer dielectric portions adjacent either side of the pass transistor to include covering a space between the pass transistor and the storage capacitor; forming a photoresist mask portion covering the pass transistor and exposing the storage capacitor; and, carrying out a P type ion implantation and drive in process to form a P doped channel region in the semiconductor substrate underlying the storage capacitor.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the formation of a planar storage capacitor with an oxide dielectric, it will be appreciated that the 1T DRAM device of the present invention is preferably formed using thin silicon dioxide gate dielectrics and preferably operated in depletion mode but may be formed using other capacitor dielectric materials including high dielectric constant materials, for example having a dielectric constant of greater than about 10.

Figure 1A:
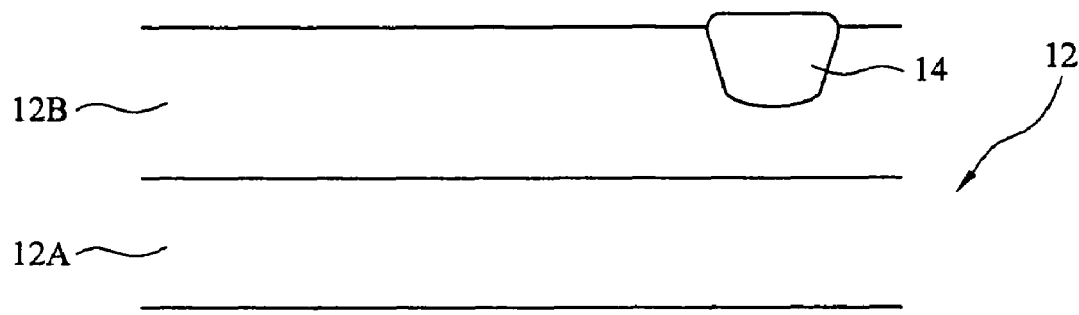
FIGS. 1A-1F are cross sectional views of a portion of a single transistor DRAM (1T DRAM) device at stages in manufacture according to an embodiment of the invention.

Referring to FIG. 1A is shown a cross sectional view of a portion of a process wafer having formed therein an exemplary shallow trench isolation (STI) structure 14 formed by conventional processes in a semiconductor substrate 12, e.g., a silicon substrate, having a P-doped region 12A and an N-well doped region 12B formed adjacent to the STI structure 14 forming an active region of the semiconductor substrate.

Still referring to FIG. 1A, the STI structure 14 is formed by conventional processes including conventional lithographic and etching processes whereby an STI trench is etched into the substrate 12 using a nitride hardmask layer (not shown) and preferably having sidewalls formed at an angle with respect to horizontal of from about 70 to about 85 degrees and having rounded bottom corners to reduce current leakage. The STI trench is then backfilled with silicon oxide by e.g., an HDP-CVD process followed by CMP planarization and hardmask removal to form STI structure 14.

Figure 1B:
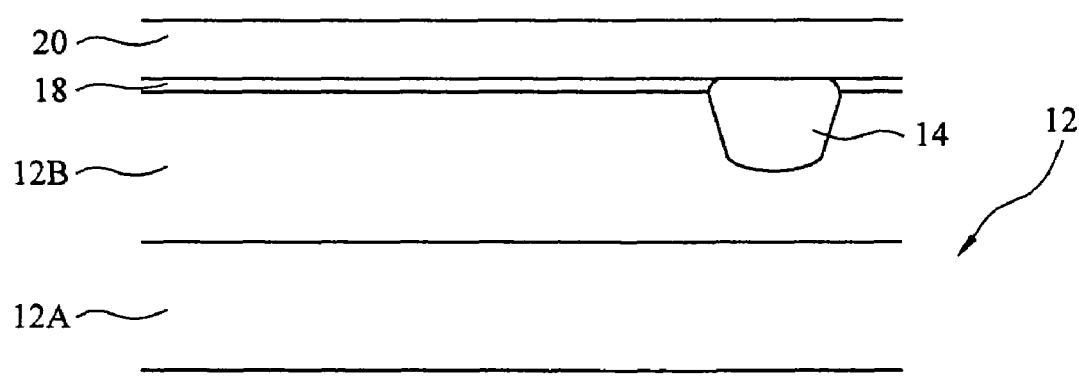

Referring to FIG. 1B, a gate dielectric layer or stack of layers e.g., 18, is formed over the silicon substrate 12. In a preferred embodiment, the gate dielectric is formed of a silicon dioxide ($SiO_2$) layer, preferably thermally grown, for example, by conventional wet or dry methods at temperatures from about 900° C. to about 1150° C. and preferably having a thickness of from about 20 to about 50 Angstroms. It will be appreciated that the gate oxide layer e.g., 18 may be subjected to nitridation techniques such as nitrogen containing plasma and/or annealing treatments to increase the dielectric constant. In addition, alternating layers of silicon oxide/silicon nitride or silicon oxynitride, also referred to as an oxide/nitride gate dielectric may be formed as the gate dielectric stack e.g., 18.

It will be appreciated that other dielectrics may be used to form the gate dielectric 18, such as one or more layers of a high-K dielectric (e.g., dielectric constant greater than about 10), for example, tantalum pentaoxide (e.g., $Ta_2O_5$). Other metal oxides such as, titanium oxides, (e.g., $TiO_2$), hafnium oxides (e.g., $HfO_2$), yttrium oxides (e.g., $Y_2O_3$), lanthanum oxides (e.g., $La_2O_5$), zirconium oxides (e.g., $ZrO_2$), and silicates and aluminates thereof may also be suitably used to form the gate dielectric 18, for example having an equivalent oxide thickness (EOT) of an $SiO_2$ gate dielectric, e.g., having a thickness of from about 50 Angstroms to about 200 Angstroms formed over a thermally grown interfacial oxide layer (not shown) formed on the silicon substrate 12. For example, atomic layer chemical vapor deposition (ALCVD) methods, followed by annealing treatments in oxygen, nitrogen and/or hydrogen may be used to form a high-K gate dielectric layer stack. Further, other high dielectric constant (high-K) materials, such as $BaSrTiO_3$ (BST), and $PbZrTiO_3$ (PZT) or other high-K materials, preferably having a dielectric constant greater than about 10, more preferably about 20, may be suitably used to form a high-K gate dielectric stack.

Still Referring to FIG. 1B, a polysilicon layer 20 is deposited over the gate dielectric layer 18 by conventional techniques e.g., an LPCVD or PECVD process to a thickness of about 2000 Angstroms to about 4000 Angstroms.

Figure 1C:
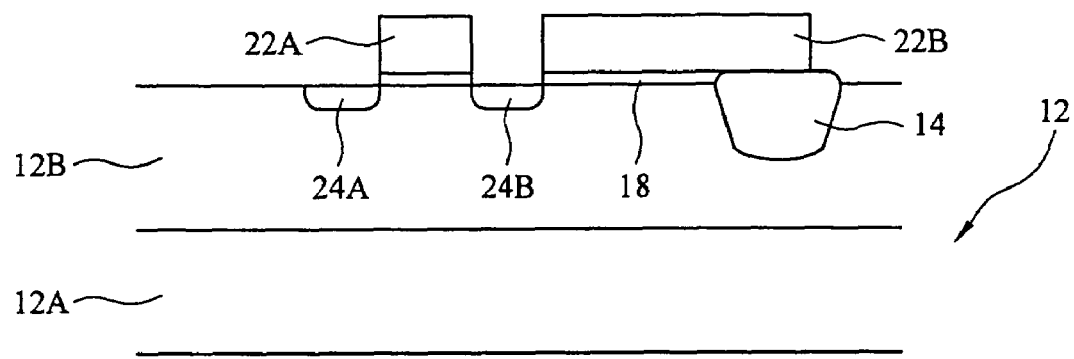

Referring to FIG. 1C, a conventional photolithographic patterning and etching process is carried out on the polysilicon layer 20 to define the pass transistor gate electrode e.g., 22A and to define the storage capacitor electrode e.g., 22B for forming the single transistor DRAM device (cell). Preferably, the storage capacitor structure is formed as a planar capacitor. For example, the capacitor dielectric e.g., gate dielectric layer 18 as well as the overlying polysilicon electrode portion (e.g., plate) 22B is formed co-planar with the silicon substrate 12 process surface.

Still referring to FIG. 1C, a first ion implantation P type doping process (e.g., LDD implant), is then carried to form P doped regions e.g., 24A and 24B, adjacent either side of the pass transistor electrode 22A. It will be appreciated that the pass transistor and storage capacitor electrodes are exposed and doped during the first ion implantation process. A P type dopant, preferably boron, e.g., from $BF_2$, is preferably implanted at a dose (concentration) ranging from about $10^{12}$ to about $10^{14}$ dopant atoms/$cm^2$, (e.g., to form a P– doped region). It will be appreciated that other methods to achieve a shallow implant may be used, e.g., from about 200 Angstroms to about 1000 Angstroms in depth, depending on the scaled design of the transistor, for example less than about 0.25 micron CMOS device characteristic dimensions, including less than about 0.18 micron CMOS characteristic dimensions. For example, gas immersion laser doping and plasma immersion doping methods as are known in the art may be used, however, ion implantation methods are preferred.

Figure 1D:
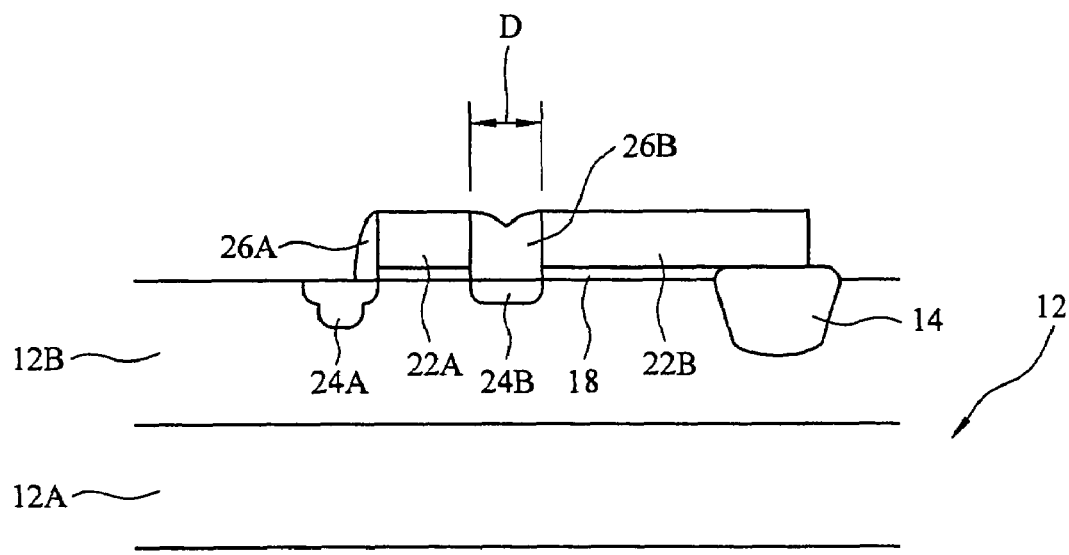

Referring to FIG. 1D, sidewall spacer dielectric material, for example including one or more layers of silicon oxide ($SiO_2$), silicon nitride (e.g., SiN), and silicon oxynitride (e.g., SiON) is first deposited, for example using a blanket deposition process (e.g., substantially conformal) such as LPCVD, PECVD or HDP-CVD, to about a thickness of a desired sidewall spacer width for example, between about 500 Angstroms and about 2000 Angstroms, preferably equal to or greater than the distance D between pass transistor 22A and storage capacitor 22B electrodes. A conventional wet or dry etchback process, preferably a dry (plasma assisted) etchback process is then carried out to etchback the sidewall spacer dielectric layer to form sidewall spacers e.g., 26A adjacent the pass transistor 22A and leaving a sidewall spacer layer portion 26B remaining at least partially filling, preferably substantially filling, the space between the storage capacitor 22B and the pass transistor 22A to cover P doped region 24B.

Still referring to FIG. 1D, a second P type dopant ion implantation process, e.g., using boron, e.g. from a $BF_2$ source, is then carried out to increase the P doping concentration in doped region e.g., 24A to form a P+ doped region, e.g., having a dopant concentration of greater than about $10^{15}$ dopant atoms/$cm^2$.

Figure 1E:
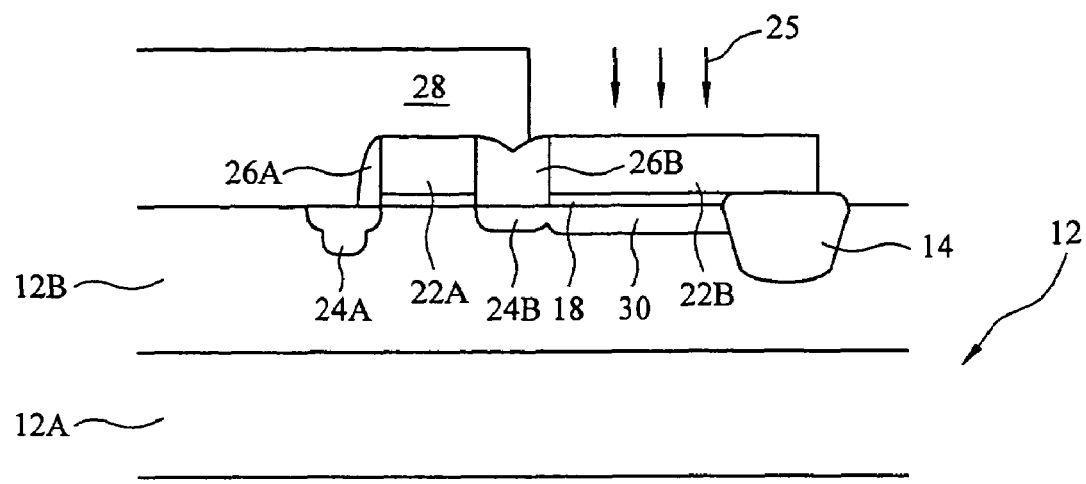

Referring to FIG. 1E, in an important aspect of the invention, a photoresist layer portion 28 is then formed by a conventional photolithographic patterning process to cover the pass transistor 22A active region including adjacent doped region 24A (e.g., bit line landing area). A third P type ion implantation process (e.g., indicated by arrows 25), preferably using boron, e.g., a $BF_2$ source, is then carried out preferably at an implantation energy of greater than about 10 keV to increase a penetration depth of implanted boron (B) atoms into the storage capacitor electrode 22B. Following removal of photoresist portion 28, a drive in process is then preferably carried out, e.g., using a rapid thermal process (RTP), at a temperature of about 800° C. to about 1000° C. to drive the implanted boron atoms into the semiconductor substrate 12 underlying the storage capacitor 22B to form a P doped channel region 30 (e.g., P– region, less than about $10^{15}$ dopant atoms/$cm^2$) underlying the storage capacitor 22B. In addition, penetration of doped boron from the storage capacitor 22B migrates laterally to the P– doped region 24B, advantageously reducing a series resistance between the pass transistor 22A and the storage capacitor 22B to improve read and write operations at operating Voltages.

Figure 1F:
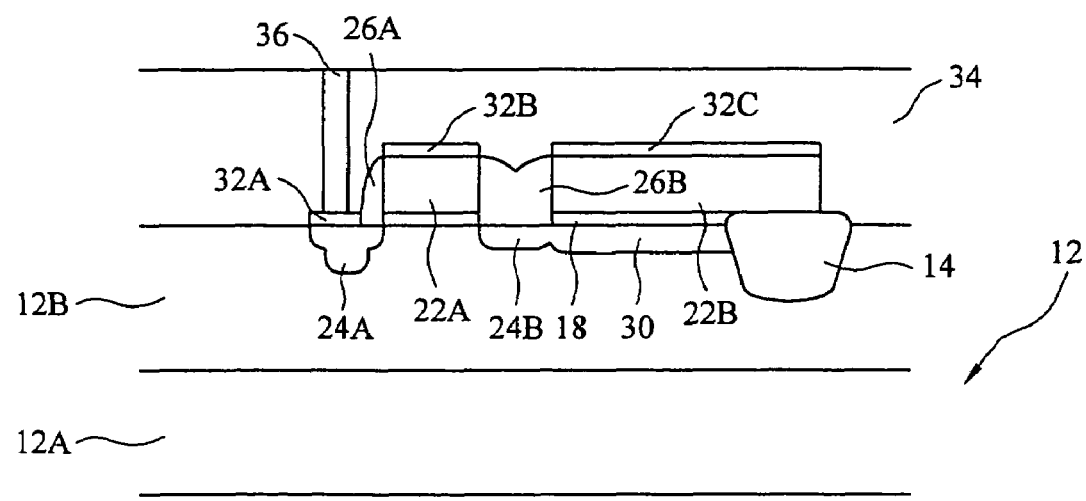

Referring to FIG. 1F, a conventional salicide (self aligned silicide) formation process is then carried after first removing the photoresist implant mask and material layers overlying portions of the silicon substrate (e.g., oxide portions over bit line landing area/source region 24A), followed by deposition of a metal, for example Ti or Co and a silicidation process to form salicides such as $TiSi_2$ or $CoSi_2$, e.g., 32A, 32B, and 32C respectively aligned over P+ doped region 24A, the pass transistor electrode 22A, and the storage capacitor electrode 22B. It will be appreciated that the boron drive in process to form the P– doped channel portion 30 underlying the storage capacitor e.g., 22B is alternatively or additionally carried out during the salicide formation process.

Still referring to FIG. 1F, conventional process are then carried out to form appropriate conductive interconnects (not shown), for example forming an overlying dielectric layer 34 and providing respective conductive interconnects e.g., bit line 36 to electrically connect to salicide portion 32A overlying P+ doped region 24A (e.g., source region). It will be appreciated interconnects may be formed to salicide portion 32B (e.g., word line) and salicide contact portion 32C of storage capacitor 22B.

Advantageously according to the 1T DRAM structure formed according to the method of the present invention, current leakage is reduced including a junction leakage path through the storage capacitor 22B by formation of the P doped channel region underlying the storage capacitor. In addition the series resistance between the pass transistor and the storage capacitor is reduced by lateral diffusion of the p doped channel region to the pass transistor LDD doped region. Consequently, the 1T DRAM transistor is able to operate in depletion at lower operating Voltages as well as increasing a charge retention time and thereby a refresh cycle time.

Figure 2:
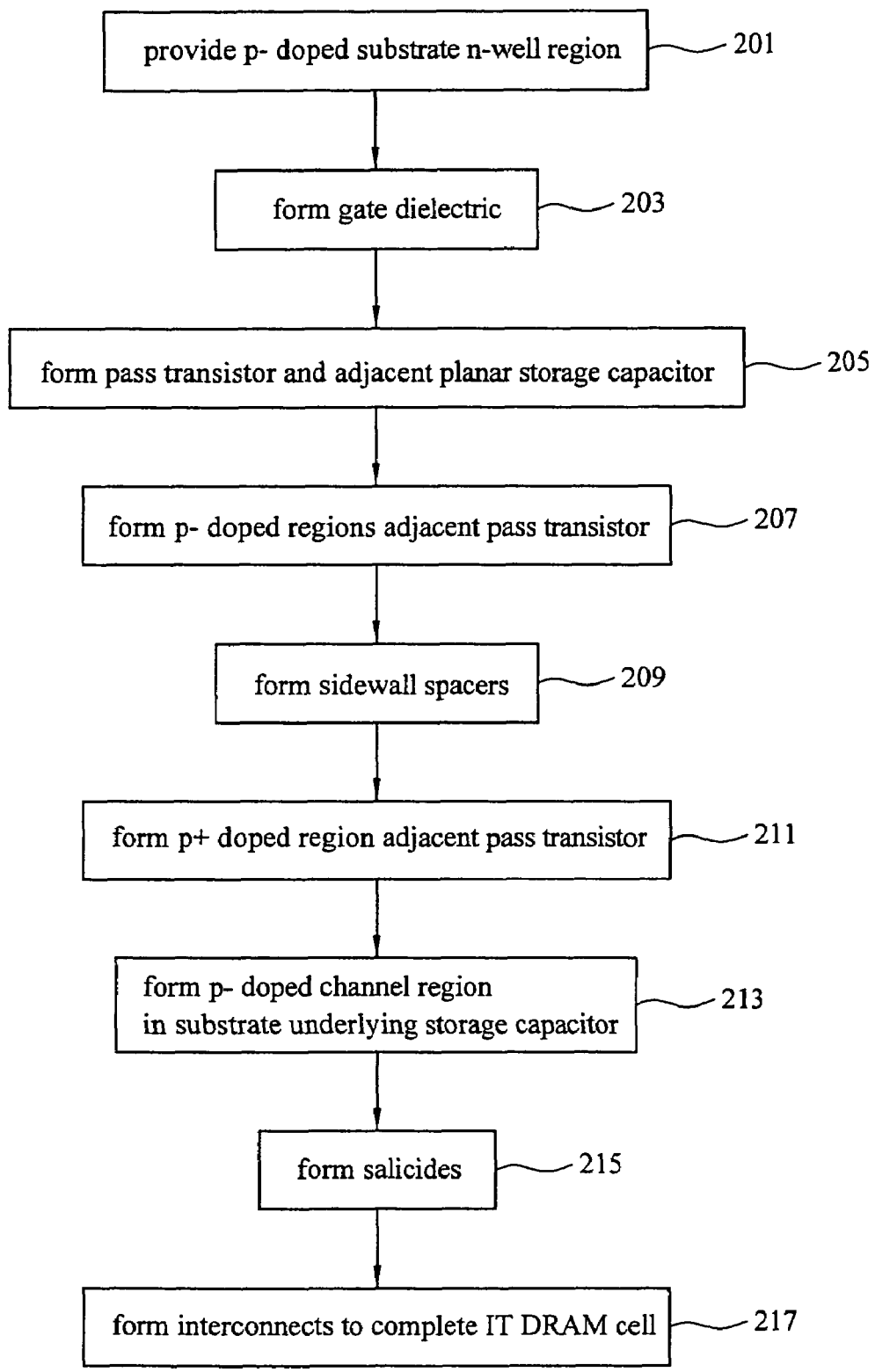
FIG. 2 is a process flow diagram including several embodiments of the present invention.

Referring to FIG. 2 is a process flow diagram including several embodiments of the present invention. In process 201, an STI structure is provided in a P-doped silicon substrate with an N-well active area. In process 203 a gate dielectric layer is formed over the silicon substrate. In process 205, a polysilicon layer is deposited and etched to form a pass transistor structure adjacent a storage capacitor over the N-well active area. In process 207, a first P type dopant ion implant process is carried out to form first doped regions (e.g., P−) adjacent either side of the pass transistor. In process 209, dielectric sidewall spacers are formed adjacent the pass transistor to include fully masking the space between the pass transistor and storage capacitor. In process 211 a second P type dopant ion implant process is carried out to form a second doped region (e.g., P+) on the unmasked side of the pass transistor (bit landing area/source region). In process 213, a third P type dopant ion implantation process is carried to selectively ion implant the storage capacitor electrode followed by a drive in process to form a P doped channel region (e.g. P−) underlying the storage capacitor. In process 215, salicide regions are formed over the bit line landing area, the pass transistor, and the storage capacitor. In process 217, conductive interconnects including a bit line area formed in an overlying dielectric insulating layer to complete formation of a single transistor (1T) RAM memory cell.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A single transistor planar DRAM device comprising:
a semiconductor substrate;
a gate dielectric on the semiconductor substrate;
a pass transistor structure and an adjacent a storage capacitor structure on the gate dielectric;
self-aligned silicided regions over a bit line landing area adjacent the pass transistor and the storage capacitor, wherein the silicide regions comprise a silicide selected from the group consisting of TiSi2 and CoSi2;
sidewall spacer dielectric portions adjacent either side of the pass transistor to include covering a space between the pass transistor and the storage capacitor; and,
a P doped channel region in the semiconductor substrate underlying the storage capacitor.

2. The single transistor planar DRAM device of claim 1, wherein the gate dielectric is selected from the group consisting of $SiO_2$, nitrided $SiO_2$, oxide/nitride, and high-K dielectrics.

3. The single transistor planar DRAM device of claim 2, wherein the high-K dielectrics comprises a dielectric selected from the group consisting of $Ta_2O_5$, $TiO_2$, $HfO_2$, $Y2O_3$, $La_2O_5$, $ZrO_2$, BST, and PZT.

4. The single transistor planar DRAM device of claim 1, wherein the storage capacitor structure is formed at least partially overlying an STI structure formed in the semiconductor substrate.

5. The single transistor planar DRAM device of claim 1, wherein the pass transistor structure and the storage capacitor structure comprise a memory cell toned over an N doped well region of a P doped silicon substrate.

6. The single transistor planar DRAM device of claim 1, further comprising second P doped regions adjacent either side of the pass transistor the second P doped regions comprising a relatively highly doped bit line landing area and a relatively lightly doped area underlying a space between the pass transistor structure and the storage capacitor structure.

7. The single transistor planar DRAM device of claim 1, wherein the spacer dielectric layer comprises one or more layers selected from the group consisting of silicon oxide, silicon nitride, and silicon oxynitride.

8. The single transistor planar DRAM device of claim 1, wherein the pass transistor structure and the storage capacitor structure comprise polysilicon electrodes.

9. The single transistor planar DRAM device of claim 1, wherein the P doped channel region comprises boron.

10. The single transistor planar DRAN device of claim 1, wherein the P doped channel region has a depth of from about 100 Angstroms to about 800 Angstroms.

11. The single transistor planar DRAM device of claim 1, wherein the P doped channel region extends laterally to an area underlying the space between the pass transistor and the storage capacitor.

* * * * *